United States Patent
Pardoe

(10) Patent No.: US 9,966,143 B2
(45) Date of Patent: May 8, 2018

(54) SOLID STATE DRIVE WITH IMPROVED POWER EFFICIENCY

(71) Applicant: Toshiba Memory Corporation, Minato-ku, Tokyo (JP)

(72) Inventor: Stephen K. Pardoe, Swindon (GB)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/173,945

(22) Filed: Jun. 6, 2016

(65) Prior Publication Data

US 2017/0352422 A1    Dec. 7, 2017

(51) Int. Cl.
| | |
|---|---|
| *G11C 16/10* | (2006.01) |
| *G11C 16/26* | (2006.01) |
| *G11C 16/30* | (2006.01) |
| *G11C 16/14* | (2006.01) |

(52) U.S. Cl.
CPC ............ *G11C 16/10* (2013.01); *G11C 16/14* (2013.01); *G11C 16/26* (2013.01); *G11C 16/30* (2013.01)

(58) Field of Classification Search
CPC ......... G11C 16/10; G11C 16/14; G11C 16/26; G11C 16/30
USPC .................................................... 365/185.24
See application file for complete search history.

(56) References Cited

U.S. PATENT DOCUMENTS

| | | | |
|---|---|---|---|
| 2004/0036449 A1 | 2/2004 | Bean et al. | |
| 2006/0002220 A1* | 1/2006 | Spengler | G11C 11/406 365/222 |
| 2010/0332859 A1* | 12/2010 | Trantham | G06F 1/26 713/300 |
| 2010/0332896 A1* | 12/2010 | Wilson | G06F 1/30 714/14 |
| 2015/0268709 A1* | 9/2015 | Morning-Smith | G06F 1/28 307/23 |
| 2016/0077560 A1 | 3/2016 | Stickel et al. | |

* cited by examiner

*Primary Examiner* — Alexander Sofocleous
*Assistant Examiner* — Alfredo Bermudez Lozada
(74) *Attorney, Agent, or Firm* — White & Case LLP

(57) ABSTRACT

A solid state drive (SSD) with improved power efficiency includes one or more non-volatile memory devices configured to operate according to a programming voltage for a program function or an erase function and to a supply voltage for a read function. The SSD also includes a voltage regulator, external of the one or more non-volatile memory devices, having an output connected to the one or more non-volatile memory devices to supply the programming voltage and an input connected to receive a first voltage, the voltage regulator configured to convert the first voltage to the programming voltage. A discrete capacitor is connected to supply the first voltage to the voltage regulator. The one or more non-volatile memory devices operate according to the programming voltage supplied by the voltage regulator during both the normal operation of the SSD and in the event of a power loss or failure of the SSD.

22 Claims, 4 Drawing Sheets

SOLID STATE DRIVE WITH IMPROVED POWER EFFICIENCY

FIELD OF THE INVENTION

This invention generally relates to improved power efficiency for solid state drives (SSDs).

BACKGROUND OF THE INVENTION

As the solid state drive (SSD) plays an increasingly important role in computer and enterprise storage, there is a correlated increase in importance and reliance on the use of backup power sources, such as capacitors in the form of supercapacitors, to help prevent data loss in the SSD from occurring due to a power outage or power loss. When a power outage or power loss occurs for a host device, such as a computer, with an SSD, the energy stored by a supercapacitor provides backup power to ensure that all pending commands are successfully completed by the SSD, all critical data is saved, and the SSD can shut down properly. The time during which the supercapacitor provides backup power is often referred to as the hold-up time. Absent the supercapacitor, critical data that is lost during the power outage or power loss may result in unrecoverable errors once power is restored.

Typically, SSDs that are equipped with a supercapacitor as a backup power source keep the voltage stored within the supercapacitor ring-fenced, not using it for any other purpose than to provide backup power during a power outage or power loss event. During a power outage or power loss event, the SSD switches the power source to the supercapacitor, causing a drop in power efficiency due to the increased voltage conversion losses when using a supercapacitor as the main power supply. The reduction in power efficiency as a result of the switch to the supercapacitor reduces the amount of time the SSD can remain powered by the supercapacitor. Thus, in order to keep the SSD powered for a sufficient amount of time to ensure that all pending commands are successfully completed by the SSD and all critical data is saved, a supercapacitor with a larger capacity is required, thereby increasing the cost and possibly the physical size of the SSD.

There is, therefore, an unmet demand for SSDs with backup supercapacitors having improved power efficiency during a power loss or power failure event.

BRIEF DESCRIPTION OF THE INVENTION

In one embodiment, a solid state drive (SSD) includes one or more non-volatile memory devices configured to operate according to a programming voltage for a program function or an erase function and to a supply voltage for a read function. The SSD further includes a voltage regulator, external of one or more non-volatile memory devices having an output connected to the one or more non-volatile memory devices to supply the programming voltage and an input connect to receive a first voltage, the voltage regulator configured to convert the first voltage to the programming voltage. A discrete capacitor is connected to supply the first voltage to the voltage regulator, and an energy management device is coupled to charge the discrete capacitor during a normal operation of the SSD. During both the normal operation of the SSD and in the event of a power loss or failure of the SSD, the one or more non-volatile memory devices operate according to the programming voltage supplied by the voltage regulator. In one embodiment, the non-volatile memory devices are NAND flash memory devices.

In one embodiment, the SSD further includes a second voltage regulator, external of the one or more non-volatile memory devices, having an output connected to one or more non-volatile memory devices to supply the supply voltage and an input connected to receive a second voltage, the second voltage regulator configured to convert the second voltage to the supply voltage. In this embodiment, the discrete capacitor is connected to supply the first voltage to the energy management device, and the energy management device is connected to supply the second voltage to the voltage regulator. The energy management device is configured to convert a third voltage to the second voltage during the normal operation of the SSD, and to convert the first voltage to the second voltage in the event of a power loss or failure of the SSD. In one embodiment, at least one of the voltage regulator and second voltage regulator are a part of the energy management device. In another embodiment, the energy management device is a system-on-chip (SoC).

In one embodiment, the one or more non-volatile memory devices includes a third voltage regulator having an input connected to receive the supply voltage and configured to convert the supply voltage to the programming voltage. In one embodiment, the one or more non-volatile memory devices operate according to the programming voltage supplied by the third voltage regulator at a predetermined time after the event of the power loss or failure of the SSD occurs. In another embodiment, the one or more non-volatile memory devices operate according to the programming voltage supplied by the third voltage regulator once the first voltage falls below a predetermined threshold voltage after the event of the power loss or failure of the SSD occurs.

In one embodiment, the one or more non-volatile memory devices are configured to only operate according to the programming voltage supplied by the second voltage regulator if there are pending program or erase commands at the predetermined time. In one embodiment, the predetermined time is between 80% and 85% of the minimum hold-up time required to ensure that all pending commands are successfully completed by the SSD and all critical data is saved. In another embodiment, the one or more non-volatile memory devices are configured to only operate according to the programming voltage supplied by the second voltage regulator if there are pending program or erase commands once the first voltage falls below the predetermined threshold voltage or the predetermined threshold energy. In one embodiment, the predetermined threshold voltage is 50% or less of the first voltage of the discrete capacitor when substantially fully charged. In one embodiment, the predetermined threshold energy is 25% or less of the energy of the discrete capacitor when fully charged.

In one embodiment, a method of powering one or more non-volatile memory devices within an SSD includes operating the one or more non-volatile memory devices according to a programming voltage for a program function or an erase function and to a supply voltage for a read function. The method further includes supplying a first voltage with a discrete capacitor and converting the first voltage to a programming voltage. The programming voltage is supplied to the one or more non-volatile memory devices during both a normal operation for the SSD and in the event of a power loss or failure of the SSD. The method further includes charging the discrete capacitor during the normal operation of the SSD. In one embodiment, the non-volatile memory devices are NAND flash memory devices.

In one embodiment, the method further includes converting a second voltage to a third voltage during the normal operation of the SSD, and converting the first voltage to the third voltage in the event of a power loss or failure. The method further includes converting the third voltage to the supply voltage and supplying the supply voltage to the one or more non-volatile memory devices.

In one embodiment, the method further includes converting the supply voltage supplied to the one or more non-volatile memory devices to the programming voltage at a predetermined time after the event of the power loss or failure of the SSD occurs. In another embodiment, the method further includes converting the supply voltage supplied to the one or more non-volatile memory devices to the programming voltage once the first voltage falls below a predetermined threshold voltage after the event of a power loss or failure of the SSD occurs.

In one embodiment, the supply voltage is converted to the programming voltage only if there are pending program or erase commands at the predetermined time. In one embodiment, the predetermined time is between 80% and 85% of the minimum required hold-up time. In another embodiment, the supply voltage is converted to the programming voltage only if there are pending program or erase commands once the first voltage falls below the predetermined threshold voltage or predetermined threshold energy. In one embodiment, the predetermined threshold voltage is 50% or less of the first voltage supplied by the discrete capacitor when substantially fully charged. In one embodiment, the predetermined threshold energy is 25% or less of the energy of the discrete capacitor when substantially fully charged.

DETAILED DESCRIPTION OF THE INVENTION

Figure 1:
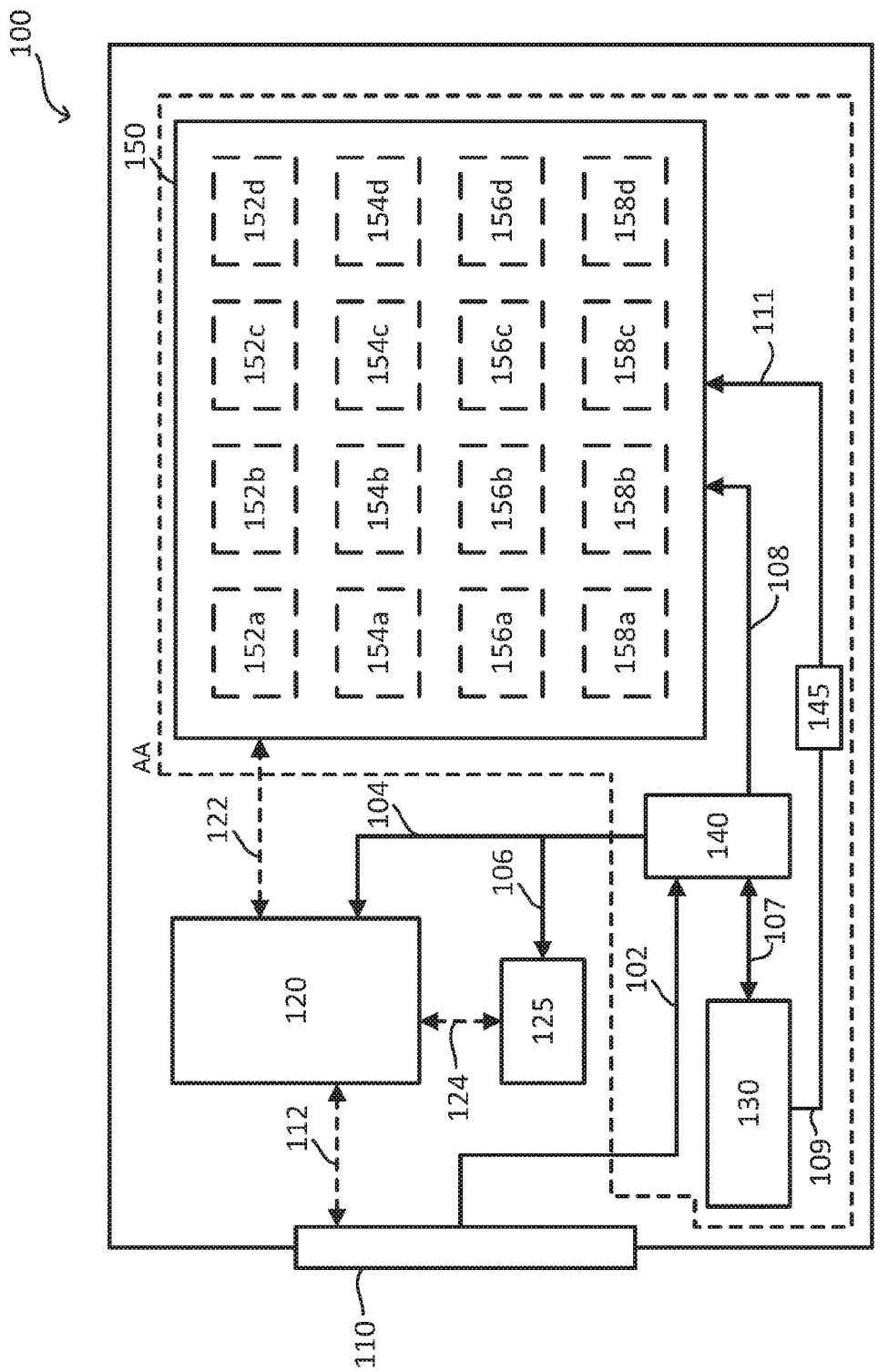
FIG. 1 is a block diagram of the structure of an SSD, according to one embodiment of the invention.

FIG. 1 shows a block diagram of the structure of an SSD 100, according to one embodiment of the invention. As shown in FIG. 1, an SSD controller 120 is in communication 112 with a host device (not shown) through a host interface 110. The host device may comprise any suitable device, such as a computer or mass storage appliance. The SSD 100 includes both a volatile memory 125, and an array of non-volatile memory devices 150. The volatile memory 125 and the array of non-volatile memory devices 150 are in communication 124 and 122, respectively, with the SSD controller 120. The array of non-volatile memory devices 150 comprises non-volatile memory devices 152a-d, 154a-d, 156a-d, and 158a-d that may be arranged in one or more channels in communication 122 with the SSD controller 120. In one embodiment, the volatile memory 125 comprises a volatile memory DRAM buffer. In one embodiment, the non-volatile memory devices 152a-d, 154a-d, 156a-d, and 158a-d comprise NAND flash memory.

The SSD 100 further includes an energy management unit (EMU) 140 that is configured to receive a host voltage 102 from the host device through the host interface 110, and provides operating voltages 104 and 106 to the SSD controller 120 and volatile memory device 125, respectively. The EMU may be implemented as a single semiconductor device, or as a combination of multiple semiconductor devices. The SSD 100 is additionally equipped with backup capacitor, supercapacitor 130.

The EMU 140 is further configured to sense a voltage stored in the supercapacitor 130 and to charge the supercapacitor 130 if the voltage stored in the supercapacitor 130 falls below a predetermined threshold during the normal operation of the SSD 100. Over time, capacitor charge capacity degrades. As such, the predetermined threshold for charging the supercapacitor 130 may also vary as time passes. Once the supercapacitor 130 is substantially fully charged, the EMU 140 may stop charging the supercapacitor 130 until the voltage stored in the supercapacitor 130 once again falls below the predetermined threshold during the normal operation of the SSD 100. Because capacitors have a certain amount of leakage that may vary over time as well, supercapacitor 130 can be considered to be substantially fully charged if it is near its full possible charge.

In one embodiment, the EMU 140 is configured to trickle charge the supercapacitor 130. In the event of a power loss or failure, the supercapacitor 130 provides power to the EMU 140 in order to keep the SSD controller 120 and volatile memory 125 powered in order to ensure that all pending commands are successfully completed by the SSD controller 120, all necessary data from the volatile memory 125 is copied over to the non-volatile memory devices 152a-d, 154a-d, 156a-d, and 158a-d of the array of non-volatile memory devices 150, and the SSD 100 can shut down properly.

The EMU 140 is configured to provide a voltage 108, and the supercapacitor 130 is configured to provide a voltage 109 that is converted by voltage regulator 145 to a programming voltage ($V_{pp}$) 111 to the non-volatile memory devices 152a-d, 154a-d, 156a-d, and 158a-d of the array of non-volatile memory devices 150. Each of the non-volatile memory devices 152a-d, 154a-d, 156a-d, and 158a-d require $V_{pp}$ to program and erase data and a supply voltage ($V_{cc}$) to perform reads and other functions of the non-volatile memory devices 152a-d, 154a-d, 156a-d, and 158a-d. Typically, for NAND flash memory devices, the $V_{pp}$ is 12V and $V_{cc}$ is 2.4V. However, as NAND flash technology improves, $V_{pp}$ and/or $V_{cc}$ may correspondingly decrease. In one embodiment, both the supercapacitor 130 and the EMU 140 are capable of providing an external $V_{pp}$ to each of the non-volatile memory devices 152a-d, 154a-d, 156a-d, and 158a-d. In another embodiment, the supercapacitor 130 provides the external $V_{pp}$ 111, and the EMU 140 provides $V_{cc}$ that can then be converted into a $V_{pp}$ internally within each of the non-volatile memory devices 152a-d, 154a-d, 156a-d, and 158a-d.

In one embodiment, the supercapacitor 130 is configured to provide an external $V_{pp}$ 111 (via the voltage regulator 145) to each of the non-volatile memory devices 152a-d, 154a-d, 156a-d, and 158a-d during both a normal operation of the SSD 100 and in the event of a power loss or failure of the SSD 100. In this manner, the EMU 140 supplies $V_{cc}$ to each of the non-volatile memory devices 152a-d, 154a-d, 156a-d, and 158a-d, but the non-volatile memory devices 152a-d, 154a-d, 156a-d, and 158a-d do not need to convert $V_{cc}$ to $V_{pp}$ internally, thereby eliminating the loss in efficiency as done in the prior art.

In another embodiment, the EMU 140 is configured to provide $V_{cc}$ that can then be converted into a $V_{pp}$ internally within each of the non-volatile memory devices 152a-d, 154a-d, 156a-d, and 158a-d after a predetermined time after the power loss or failure event occurs or after the voltage of the supercapacitor 130 falls below a predetermined threshold voltage after the power loss or failure event occurs. The $V_{cc}$ provided by the EMU 140 is derived from the residual voltage remaining within the supercapacitor 130. This way, after the voltage of the supercapacitor has been depleted below a level to provide sufficient voltage to voltage regulator 145 to supply an external $V_{pp}$ 111, the non-volatile memory devices 152a-d, 154a-d, 156a-d, and 158a-d can use the voltage provided by the EMU 140 to generate an internal $V_{pp}$ to further extend the amount of time the non-volatile memory devices 152a-d, 154a-d, 156a-d, and 158a-d can remain powered after the power loss or failure event occurs, due to the fact that EMU 140 can operate with a lower supercapacitor voltage than the voltage regulator 145 requires.

In one embodiment, the EMU 140 provides the voltage to the non-volatile memory devices 152a-d, 154a-d, 156a-d, and 158a-d at a time between 80% and 85% of the minimum hold-up time required after the power loss or failure event occurs, to ensure that all pending commands are successfully completed by the SSD and all critical data is saved. In one embodiment, the EMU 140 provides the voltage to the non-volatile memory devices 152a-d, 154a-d, 156a-d, and 158a-d when the voltage of the supercapacitor 130 falls below 25% of its energy capacity when substantially fully charged. Accordingly, the SSD 100 not only has improved power efficiency during a power loss or failure event as compared to the prior art, but is also capable of further extending the amount of time the non-volatile memory devices 152a-d, 154a-d, 156a-d, and 158a-d remain powered to ensure all critical data is saved and the SSD 100 can properly shut down as compared to a prior art SSD device having the same supercapacitor 130.

Figure 2:
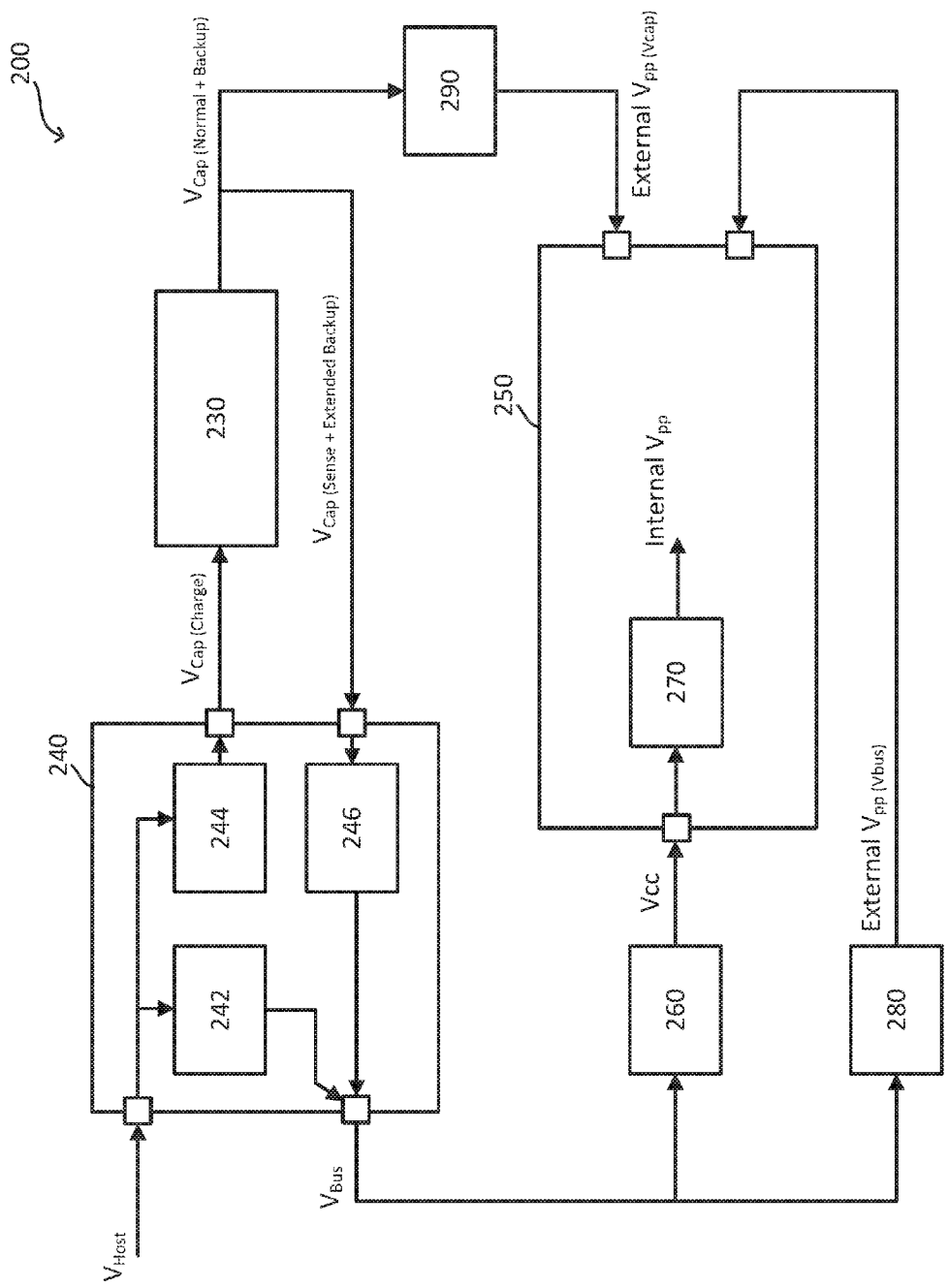
FIG. 2 is a block diagram of the power circuit of an SSD, according to one embodiment of the invention.

FIG. 2 is a block diagram of the power circuit of an SSD 200, according to one embodiment of the invention. The block diagram shown in FIG. 2 corresponds to the dotted region AA of the SSD 100 shown in FIG. 1. As shown in FIG. 2, an EMU 240 is configured to receive a voltage $V_{Host}$ from a host device connected to the SSD 200. Typically, $V_{Host}$ is about 5V, however $V_{Host}$ may vary depending on the type of interface connecting the SSD 200 to the host device. The EMU 240 then up-converts the $V_{Host}$ with a voltage regulator 244 to generate a charging voltage $V_{Cap\ (Charge)}$ that is provided to charge a supercapacitor 230 connected to the EMU 240.

In general, $V_{Host}$ will be much lower than the voltage capacity of the supercapacitor 230, thus requiring the voltage regulator 244 to up-convert $V_{Host}$ in order to generate $V_{Cap\ (Charge)}$. Typically, the supercapacitor 230 may store up to 45V, or more, when fully charged. The voltage regulator 244 may be a step-up or boost converter. A voltage $V_{Cap\ (Sense+Extended\ Backup)}$ from the supercapacitor 230 is fed back into the EMU 240. The $V_{Cap\ (Sense+Extended\ Backup)}$ can be used by the EMU 240 to sense the voltage of the supercapacitor 230 so that EMU 240 can provide $V_{Cap\ (Charge)}$ when necessary to keep the supercapacitor 230 charged with $V_{Host}$ during the normal operation of the SSD 200. In one embodiment, EMU 240 is configured to trickle charge supercapacitor 230. In another embodiment, EMU 240 is configured to charge supercapacitor 230 when it detects that the charge stored in supercapacitor 230 falls below a predetermined threshold during the normal operation of the SSD 200.

In addition to $V_{Cap\ (Charge)}$, the EMU 240 is further configured to generate a bus voltage $V_{Bus}$ that is typically provided to the SSD controller 120, volatile memory, and the array of non-volatile memory devices 150 shown in FIG. 1, for example. Typically, bus voltage $V_{Bus}$ is 4.2V, but may also vary depending on the specific requirements of the components of the SSD 200. $V_{Bus}$ can be generated by either down-converting the $V_{Host}$ with voltage regulator 242 during a normal operation of the SSD 200, or down-converting the $V_{Cap\ (Sense+Extended\ Backup)}$ from the supercapacitor 230 with voltage regulator 246 during a power loss or failure event, when $V_{Host}$ becomes unavailable.

Voltage regulators 242 and 246 may be buck regulators that are commonly known to those of ordinary skill in the art. $V_{Bus}$ can then be used to generate either an external $V_{pp}$ or an internal $V_{pp}$ for a non-volatile memory device 250. Depending on the type of non-volatile memory device 250, $V_{pp}$ may vary. For current NAND Flash memory devices, $V_{pp}$ is typically 12V. While only one non-volatile memory device 250 is shown in FIG. 2, as shown in FIG. 1, SSD 200 may have an array of non-volatile memory devices each configured as shown with non-volatile memory device 250.

To generate an internal $V_{pp}$ using $V_{Bus}$, a voltage regulator 260 first down-converts the $V_{Bus}$ to generate a supply voltage $V_{cc}$, typically 2.4V, that is provided to the non-volatile memory device 250. The voltage regulator 260 may be a buck regulator. The non-volatile memory device 250 then up-converts the $V_{cc}$ to generate the internal $V_{pp}$ using another voltage regulator 270. Voltage regulator 270 is internal to the non-volatile memory device 250, and may be a step up or boost converter. $V_{Bus}$ can also be directly up-converted with a voltage regulator 280 to generate an external $V_{pp\ (Vbus)}$. The voltage regulator 280 may also be a step-up or boost converter. The downside to generating $V_{pp}$, either internal or external, from $V_{Bus}$ is that the voltage regulators 242, 246, 260, 270, and 280 are not 100% efficient, and so the multiple up-conversion and down-conversion stages necessary to generate $V_{pp}$ from $V_{Bus}$ will reduce the efficiency, particularly during a power loss or failure event when the EMU 240 must switch to the $V_{Cap\ (Sense+Backup)}$ to generate $V_{Bus}$ due to the loss of $V_{Host}$ providing power to the SSD 200 from the host device.

To reduce the number of voltage regulators required to generate $V_{pp}$ during a power loss or failure event, as shown in FIG. 2, the supercapacitor 230 can provide a voltage $V_{Cap\ (Normal+Backup)}$ that is down-converted by a single voltage regulator 290, such as a buck regulator, to generate an external $V_{pp\ (Vcap)}$. $V_{pp\ (Vcap)}$ can be provided to the non-volatile memory device 250 during both a normal operation of the SSD 200 and in the event of a power loss or failure. Switching between providing $V_{Bus}$ from $V_{Host}$ to $V_{Cap\ (Sense+Backup)}$ is still required in the event of a power loss or failure, but up-converting to provide $V_{pp}$ using voltage regulators 270 or 280 is not required, because the supercapacitor 230 is already providing $V_{Cap\ (Normal+Backup)}$ to the voltage regulator 290 to generate external $V_{pp\ (Vcap)}$, resulting in an increased power efficiency during the power loss or failure event.

For example, assuming the typical power conversion efficiency for the voltage regulators shown in FIG. 2 are as follows:

voltage regulator 242: 95% efficiency
voltage regulator 244: 90% efficiency
voltage regulator 246: 85% efficiency voltage regulator 260: 90% efficiency
voltage regulator 270: 80% efficiency
voltage regulator 280: 80% efficiency
voltage regulator 290: 85% efficiency The above efficiencies follow the general assumptions that voltage regulators that up-convert voltages are typically more inefficient than voltage regulators that down-convert voltages, and that the bigger the difference between the input and output of the voltage regulators, the more inefficient the voltage regulators become. Additionally, some voltage regulators may be designed with higher efficiencies, such as those within the EMU 240 as compared to discrete off-the-shelf components. With the above assumptions, the efficiency of generating $V_{pp}$ using the various methods described above can be calculated as follows:

During normal operation of the SSD 200:
1. Internal $V_{pp}$: 95% efficiency (voltage regulator 242 to generate $V_{Bus}$ from $V_{Host}$)×90% efficiency (voltage regulator 260 to generate $V_{cc}$ from $V_{Bus}$)×80% efficiency (voltage regulator 270 to generate internal $V_{pp}$ from $V_{cc}$)=68.4% efficiency
2. External $V_{pp\ (Vbus)}$: 95% efficiency (voltage regulator 242 to generate $V_{Bus}$ from $V_{Host}$)×80% efficiency (voltage regulator 280 to generate $V_{pp\ (Vbus)}$ from $V_{Bus}$)=76% efficiency
3. External $V_{pp\ (Vcap)}$: 90% efficiency (voltage regulator 244 to generate $V_{Cap\ (Charge)}$ from $V_{Host}$)×85% efficiency (voltage regulator 290 to generate $V_{pp\ (Vcap)}$ from $V_{Cap\ (Normal+Backup)}$)=76.5% efficiency During a power loss or failure event of the SSD 200:
1. Internal $V_{pp}$: 85% efficiency (voltage regulator 246 to generate $V_{Bus}$ from $V_{Cap\ (Sense+Extended\ Backup)}$)×90% efficiency (voltage regulator 260 to generate $V_{cc}$ from $V_{Bus}$)×80% efficiency (voltage regulator 270 to generate internal $V_{pp}$ from $V_{cc}$)=61.2% efficiency
2. External $V_{pp\ (Vbus)}$: 85% efficiency (voltage regulator 242 to generate $V_{Bus}$ from $V_{Cap\ (Sense+Extended\ Backup)}$)× 80% efficiency (voltage regulator 280 to generate $V_{pp\ (Vbus)}$ from $V_{Bus}$)=68% efficiency
3. External $V_{pp\ (Vcap)}$: 85% efficiency (voltage regulator 290 to generate $V_{pp\ (Vcap)}$ from $V_{Cap\ (Normal+Backup)}$)=85% efficiency As illustrated in this example, during both a normal operation of the SSD 200 and in the event of a power loss or failure, generating the internal $V_{pp}$ using the non-volatile memory device 250 is the least efficient method, having an efficiency of just 68.4% and 61.2%, respectively. Generating the external $V_{pp\ (Vbus)}$ and the external $V_{pp\ (Vcap)}$ using either the $V_{Bus}$ provided by the EMU 240 or the supercapacitor 230, respectively, during normal operation of the SSD 200 results in relatively equivalent efficiencies of about 76%, with external $V_{pp\ (Vcap)}$ having a slightly higher efficiency of 76.5%. Notably, during normal operation of the SSD 200, generating the external $V_{pp\ (Vcap)}$ by using the supercapacitor 230 does not result in a noticeable increase in efficiency compared to generating the external $V_{pp\ (Vbus)}$ using the $V_{Bus}$ provided by the EMU 240.

However, during a power loss or failure event, the efficiency of generating the external $V_{pp\ (Vcap)}$ with the supercapacitor 230 shoots up to 85%, about 17% more efficient than generating the external $V_{pp\ (Vbus)}$ using the $V_{Bus}$ provided by the EMU 240, and more than 23% more efficient than generating the internal $V_{pp}$ using the non-volatile memory device 250. This increase in efficiency translates directly into the supercapacitor 230 being able to power the non-volatile memory device 250 for a longer period of time as compared to a ring-fenced supercapacitor having the same voltage capacity of a prior art device.

As the voltage across the supercapacitor 230 discharges during the power loss or failure event to power the non-volatile memory device 250, $V_{Cap\ (Normal+Backup)}$ runs the risk of falling below the threshold necessary for the voltage regulator 290 to generate the external $V_{pp\ (Vcap)}$ before the non-volatile memory device 250 has completed performing all of the program and erase functions. If the non-volatile memory device 250 still needs to perform program or erase functions when this occurs, then it becomes necessary to set the non-volatile memory device 250 to generate $V_{pp}$ internally with internal voltage regulator 270, and for the EMU 240 to provide $V_{Bus}$ generated from $V_{Cap\ (Sense+Extended\ Backup)}$. This is because $V_{cc}$ and $V_{Bus}$ are lower than the $V_{pp}$ required for the non-volatile memory device 250, and as such, the corresponding voltage regulators 260 and 246 used to generate $V_{Bus}$ and $V_{cc}$, respectively, will have lower threshold voltages than the voltage regulator 290. Accordingly, the remaining voltage stored in the supercapacitor 230 may still be sufficient to generate $V_{Bus}$ and $V_{cc}$, even if it falls below the threshold of voltage regulator 290 used to generate external $V_{pp\ (Vcap)}$.

The switch between generating external $V_{pp\ (Vcap)}$ with the voltage stored on the supercapacitor 230 to generating internal $V_{pp}$ using the internal voltage regulator 270 can be triggered based on a number of predetermined events. In one embodiment, the non-volatile memory device 250 is configured to generate an internal $V_{pp}$ from $V_{cc}$ after the energy stored in the supercapacitor 230 falls below a predetermined threshold after the power loss or failure event of the SSD 200 occurs. The predetermined threshold may be, for example, after the supercapacitor 230 has only 25% or less of the energy capacity of the supercapacitor 230 when substantially fully charged or after the supercapacitor 230's voltage is 50% or less of the voltage when the supercapacitor 230 is substantially fully charged. In another embodiment, the non-volatile memory device 250 is configured to use $V_{cc}$ to generate an internal $V_{pp}$ at a predetermined amount of time after the power loss or failure event of the SSD 200 occurs. The predetermined amount of time may be, for example, at a time 80% and 85% of the minimum hold-up time required after the power loss or failure event occurs.

The predetermined threshold and predetermined time may be set based on the storage capacity of the supercapacitor 230, and the operating parameters of voltage regulators 290, 260, and 246. The energy storage of the supercapacitor 230 is a function of $V^2$ (Energy (Joules)=½$CV^2$). The initial energy of the capacitor when substantially fully charged will be ½ $CV_s^2$ where $V_s$ is the starting (substantially fully charged) voltage of the supercapacitor 230. The final energy of the supercapacitor will be ½ $CV_f^2$, where $V_f$ is the final (discharged) voltage of the supercapacitor 230 at the end of the required hold-up time, where the regulator 246 will no longer operate.

Thus, the energy supplied from start ($V_s$) to finish ($V_f$) will be ½$CV_s^2$−½$CV_f^2$=½$C(V_s^2-V_f^2)$. Because, power=energy×time, the holdup time will be (½C/power)×$(V_s^2-V_f^2)$, and the switch time will be (½C/power)×$(V_s^2-V_{sw}^2)$, where $V_{sw}$ is the supercapacitor 230's voltage at which the voltage regulator 290 will no longer operate, and $V_{pp}$ will need to be generated internally within the non-volatile memory device 250. Substituting for (½C/power), switch time=holdup time×$(V_s^2-V_{sw}^2)/(V_s^2-V_f^2)$. Assuming typical nominal values of $V_s$=35V, $V_f$=4.5V (the voltage at which the regulator 246 used to generate $V_{Bus}$ from $V_{Cap\ (Sense+Extended\ Backup)}$ will no longer operate), and $V_{sw}$=14V to 16V (the lower and upper voltage bounds at which the voltage regulator 290 will no longer operate), the (i) upper bound switch time is hold-up time×$(35^2-14^2)/(35^2-4.5^2)$=hold-up time×0.854, and the (ii) lower bound switch time is hold-up time×$(35^2-16^2)/(35^2-4.5^2)$=hold-up time×0.804.

Thus, the time at which switching from external $V_{pp}$ to internal $V_{pp}$ is between 80% and 85% of the hold-up time based on the assumed nominal values. Similarly, the predetermined voltage thresholds for switching from external $V_{pp}$ to internal $V_{pp}$ will be 16/35=0.46 for the upper bound, and 14/35=0.40 for the lower bound. To ensure that the switch occurs prior to the capacitor 230's voltage falling below $V_{sw}$, the predetermined threshold voltage may be set at 50% of or less of the supercapacitor 290's voltage when substantially fully charged. Correspondingly, the predetermined energy threshold will be $16^2/35^2$=0.21 for the upper bound, and $14^2/35^2$=0.16 for the lower bound. Again, to ensure that the switch occurs prior to the supercapacitor 230's voltage falling below $V_{sw}$, the predetermined threshold energy may be set at 25% or less of the supercapacitor 230's energy when substantially fully charged.

When the supercapacitor 230's energy falls below 1.6% of the supercapacitor 230's energy when substantially fully charged ($4.5^2/35^2$), the voltage regulator 246 will no longer operate and the non-volatile memory device 250 will no longer be able to generate $V_{pp}$ internally, thereby ceasing its ability to perform program and erase functions.

The predetermined threshold and predetermined time may be set depending on the required hold-up time, being the amount of time required to complete the program and erase functions of the non-volatile memory device 250, and the specific voltage thresholds of the voltage regulators 290, 246, and 260. For example, the predetermined threshold or predetermined time may be selected so that there is a 99% probability that the non-volatile memory device 250 is able to complete all program and erase functions before the predetermined threshold or predetermined time is reached, and in the 1% chance that the non-volatile memory device 250 still has any pending program and erase commands at the point where the predetermined threshold or where the predetermined time is reached, in which case, the non-volatile memory device 250 may rely on internally generated $V_{pp}$ to complete those program and erase functions.

As shown in FIG. 2, the programming voltage $V_{pp}$ can be provided in a number of different ways: as external $V_{pp\ (Vcap)}$, as external $V_{pp\ (Vbus)}$, and internally generated $V_{pp}$ within the non-volatile memory device 250, with external $V_{pp\ (Vcap)}$ being the most efficient during a power loss or failure event where external $V_{pp\ (Vcap)}$ is also used to provide the programming voltage to the non-volatile memory device 250 during normal operation of the SSD 200.

Figure 3:
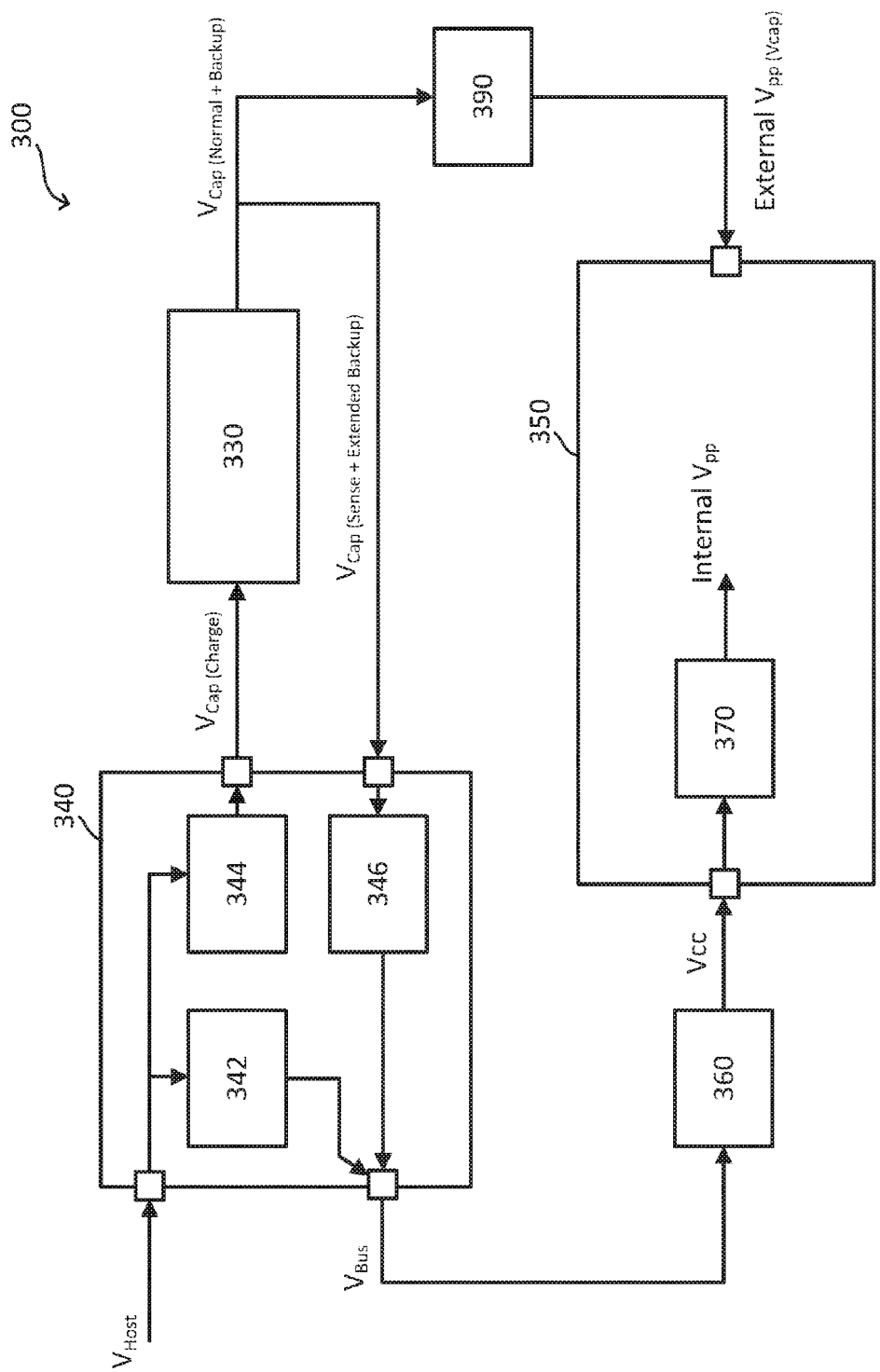
FIG. 3 is a block diagram of the power circuit of an SSD, according to another embodiment of the invention.

FIG. 3 is a block diagram of the power circuit of an SSD 300, according to another embodiment of the invention. The block diagram shown in FIG. 3 also corresponds to the dotted region AA of the SSD 100 shown in FIG. 1. As shown in FIG. 3, the voltage regulator and conducting path associated with generating an external $V_{pp}$ using $V_{Bus}$ as shown in FIG. 2 have been removed, reducing the number of overall components of the SSD 300 and simplifying the power circuit of the SSD 300.

Like SSD 200 shown in FIG. 2, an EMU 340 of SSD 300 is configured to receive a voltage $V_{Host}$ from a host device connected to the SSD 300. The EMU 340 then up-converts the $V_{Host}$ with a voltage regulator 344 to generate a charging voltage $V_{Cap\ (Charge)}$ that is provided to charge a supercapacitor 330 connected to the EMU 340. Voltage regulator 344 may be a step-up or boost converter. $V_{Cap\ (Sense+Extended\ Backup)}$ is used by the EMU 340 to sense the voltage of the supercapacitor 330 so that EMU 340 can provide $V_{Cap\ (Charge)}$ when necessary to keep the supercapacitor 330 charged with $V_{Host}$ during the normal operation of the SSD 300. In one embodiment, EMU 340 is configured to trickle charge supercapacitor 330. In another embodiment, EMU 340 is configured to charge supercapacitor 330 when it detects that the charge stored in supercapacitor 330 falls below a predetermined threshold during the normal operation of the SSD 300.

In addition to $V_{Cap\ (Charge)}$, the EMU 340 is further configured to generate a bus voltage $V_{Bus}$. $V_{Bus}$ can be generated by either down-converting the $V_{Host}$ with voltage regulator 342 during a normal operation of the SSD 300, or down-converting the $V_{Cap}$ (Sense+Extended Backup) from the supercapacitor 330 with voltage regulator 346 during a power loss or failure event, when $V_{Host}$ becomes unavailable. Voltage regulators 342 and 346 may be buck regulators. $V_{Bus}$ can then be used to generate either an external $V_{pp}$ or an internal $V_{pp}$ for a non-volatile memory device 350. As with FIG. 2, while only one non-volatile memory device 350 is shown in FIG. 3, as shown in FIG. 1, SSD 300 may have an array of non-volatile memory devices each configured as shown with non-volatile memory device 350.

A voltage regulator 360 down-converts $V_{Bus}$ to generate a supply voltage $V_{cc}$ that is provided to the non-volatile memory device 350. The voltage regulator 360 may be a buck regulator. The non-volatile memory device 350 then up-converts the $V_{cc}$ to generate the internal $V_{pp}$ using another voltage regulator 370. Voltage regulator 370 is internal to the non-volatile memory device 350, and may be a step up or boost converter. The supercapacitor 330 provides a voltage $V_{Cap\ (Normal+Backup)}$ that is down-converted by a voltage regulator 390, such as a buck regulator, to generate external $V_{pp\ (Vcap)}$. $V_{pp\ (Vcap)}$ is provided to the non-volatile memory device 350 during both a normal operation of the SSD 300 and in the event of a power loss or failure.

As shown and described in FIG. 3, the SSD 300 is capable of operating in substantially the same manner as the SSD 200 shown in FIG. 2, with the same efficiencies gained by using the supercapacitor 330 to generate the external $V_{pp\ (Vcap)}$ during both the normal operation of the SSD 300 and during the event of a power loss or failure of the SSD 300. Moreover, the switch over to internal $V_{pp}$ can still be accomplished after a predetermined time, or after the charge of the supercapacitor 330 reaches a predetermined threshold, after the power failure or loss event occurs to further extend the time the non-volatile memory device 350 is capable of performing program and erase functions as necessary.

Thus, removing the voltage regulator and conducting path associated with generating an external $V_{pp}$ using $V_{Bus}$ as shown in FIG. 2 will not affect the desired operation of the SSD 300 and efficiencies gained by using the supercapacitor 330 to generate the external $V_{pp\ (Vcap)}$ during both the normal operation of the SSD 300 and during the event of a power loss or failure of the SSD 300, while simultaneously reducing the number of overall components required by the SSD 300 and simplifying the power circuit of the SSD 300 as compared to the SSD 200 shown in FIG. 2.

Figure 4:
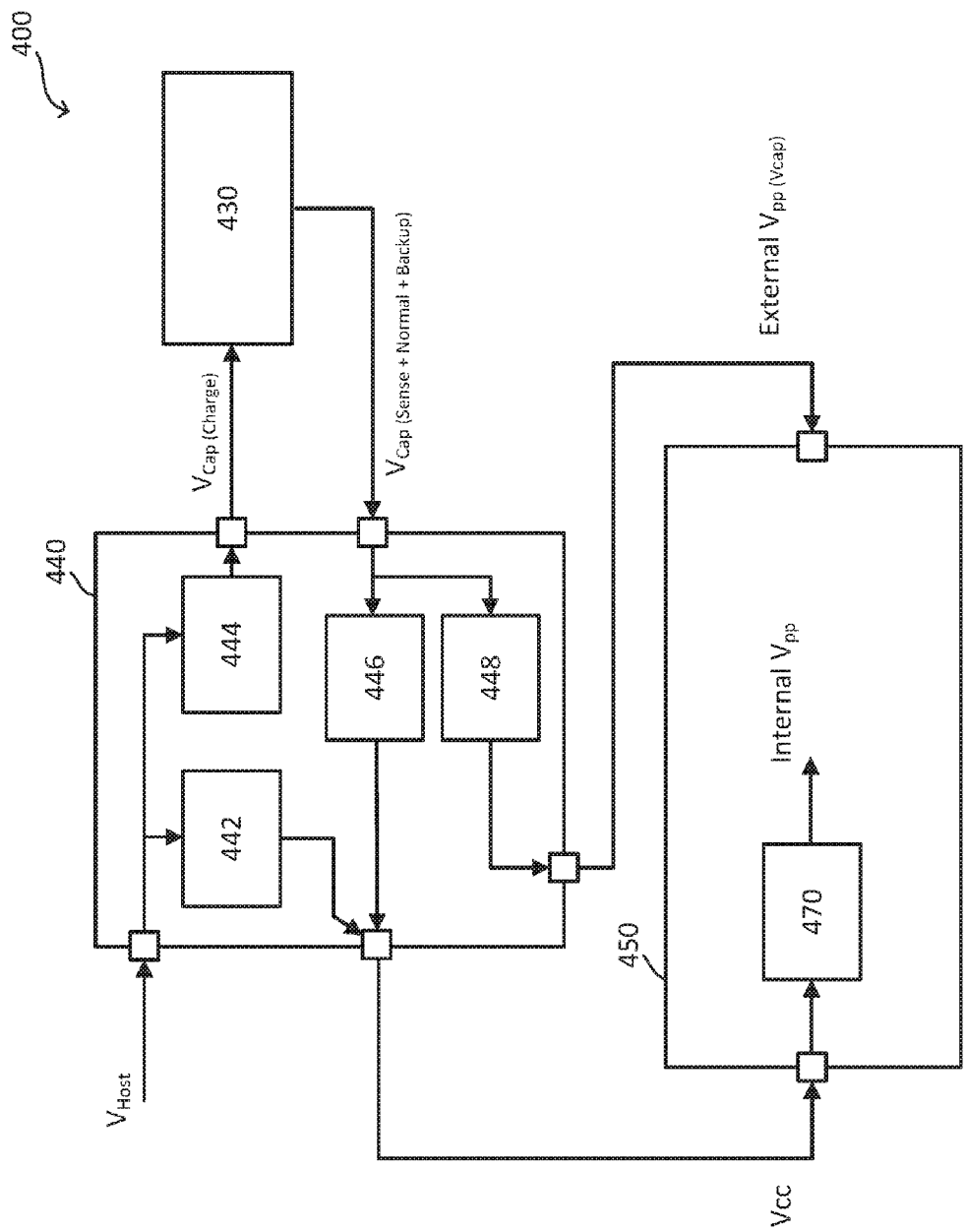
FIG. 4 is a block diagram of the power circuit of an SSD, according to another embodiment of the invention.

FIG. 4 is a block diagram of the power circuit of an SSD 400, according to another embodiment of the invention. As shown in FIG. 4, EMU 440 has integrated voltage regulators to further simplify the power circuit of the SSD 400 and reduce the number of discrete components required as compared to SSD 200 shown in FIG. 2 and SSD 300 shown in FIG. 3. In one embodiment, the EMU 440 is a system-on-a-chip (SoC). In another embodiment, the EMU 440 and voltage regulators 442, 444, 446, and 448 are part of the same package.

As with SSD 200 and SSD 300 shown in FIGS. 2 and 3, respectively, an EMU 440 of SSD 400 is configured to receive a voltage $V_{Host}$ from a host device connected to the SSD 400. The EMU 440 then up-converts the $V_{Host}$ with a voltage regulator 444 to generate a charging voltage $V_{Cap\ (Charge)}$ that is provided to charge a supercapacitor 430 connected to the EMU 440. Voltage regulator 344 may be a step-up or boost converter. $V_{Cap\ (Sense+Normal+Backup)}$ is used by the EMU 440 to sense the voltage of the supercapacitor 430 so that EMU 440 can provide $V_{Cap\ (Charge)}$ when necessary to keep the supercapacitor 430 charged with $V_{Host}$ during the normal operation of the SSD 400. In one embodiment, EMU 440 is configured to trickle charge supercapacitor 330. In another embodiment, EMU 440 is configured to charge supercapacitor 230 when it detects that the charge stored in supercapacitor 430 falls below a predetermined threshold during the normal operation of the SSD 400.

In addition to $V_{Cap\ (Charge)}$, the EMU 440 is further configured to directly generate a supply voltage $V_{cc}$ for non-volatile memory device 450. $V_{cc}$ can be generated by either down-converting the $V_{Host}$ with voltage regulator 442 during a normal operation of the SSD 400, or down-converting the $V_{Cap\ (Sense+Normal+Backup)}$ from the supercapacitor 430 with voltage regulator 446 during a power loss or failure event, when $V_{Host}$ becomes unavailable. Voltage regulators 442 and 446 may be buck regulators. $V_{cc}$ can then be up-converted by internal voltage regulator 470, such as a step-up or boost converter, to generate an internal $V_{pp}$ for a non-volatile memory device 450.

As with FIGS. 2 and 3, while only one non-volatile memory device 450 is shown in FIG. 4, as shown in FIG. 1, SSD 400 may have an array of non-volatile memory devices each configured as shown with non-volatile memory device 450. Additionally. while not shown in FIG. 4, the EMU 440 may further include voltage regulators configured to down-convert $V_{Host}$ and $V_{Cap\ (Sense+Normal+Backup)}$ to generate a bus voltage $V_{Bus}$ as necessary to provide power to an SSD controller and a volatile memory as shown in FIG. 1.

The supercapacitor 430 provides a voltage $V_{Cap\ (Sense+Normal+Backup)}$ that is down-converted by a voltage regulator 448, such as a buck regulator, to generate external $V_{pp\ (Vcap)}$. $V_{pp\ (Vcap)}$ is provided to the non-volatile memory device 450 during both a normal operation of the SSD 400 and in the event of a power loss or failure. Thus, the SSD 400 operates in substantially the same manner as the SSD 300 shown and described in FIG. 3, with the additional efficiencies gained by directly generating the supply voltage $V_{cc}$ rather than generating $V_{cc}$ by down-converting $V_{Host}$ or $V_{Cap\ (Sense+Normal+Backup)}$ with an additional voltage regulator to generate an intermediate bus voltage $V_{Bus}$. Moreover, by integrating voltage regulators 446 and 448 within the EMU 440, voltage regulators 446 and 448 may be designed to operate more efficiently as compared to off-the-shelf components, further increasing the overall efficiency of the power circuit of SSD 400, and extending the amount of time external $V_{pp\ (Vcap)}$ can be supplied to the non-volatile memory device 450.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A solid state drive (SSD) comprising:
one or more non-volatile memory devices configured to operate according to a programming voltage for a program function or an erase function and to a supply voltage for a read function;
a voltage regulator, external of the one or more non-volatile memory devices, having an output connected to the one or more non-volatile memory devices to supply the programming voltage and an input connected to receive a first voltage, the voltage regulator configured to convert the first voltage to the programming voltage during a normal operation of the SSD;
a discrete capacitor connected to supply the first voltage to the voltage regulator during the normal operation of the SSD; and
an energy management device connected to the discrete capacitor and configured to charge the discrete capacitor during the normal operation of the SSD,
wherein,
during the normal operation of the SSD, of the energy management device and the discrete capacitor, the voltage regulator is configured to receive the first voltage from only the discrete capacitor, and
the one or more non-volatile memory devices operate according to the programming voltage supplied by the output of the voltage regulator (i) during both the normal operation of the SSD and in the event of a power loss or failure of the SSD, and (ii) during normal operation for the program function or the erase function.

2. The SSD of claim 1, further comprising:
a second voltage regulator, external of the one or more non-volatile memory devices, having an output connected to the one or more non-volatile memory devices to supply the supply voltage and an input connected to receive a second voltage, the second voltage regulator configured to convert the second voltage to the supply voltage,
wherein
the discrete capacitor is connected to supply the first voltage to the energy management device,
the energy management device is connected to supply the second voltage to the second voltage regulator, and
the energy management device is configured to convert a third voltage to the second voltage during the normal operation of the SSD and to convert the first voltage to the second voltage in the event of the power loss or failure of the SSD.

3. The SSD of claim 2, wherein at least one of the voltage regulator and the second voltage regulator are a part of the energy management device.

4. The SSD of claim 2, wherein the one or more non-volatile memory devices comprise a third voltage regulator having an input connected to receive the supply voltage and configured to convert the supply voltage to the programming voltage.

5. The SSD of claim 4, wherein the one or more non-volatile memory devices operate according to the programming voltage supplied by the third voltage regulator at a predetermined time after the event of the power loss or failure of the SSD occurs.

6. The SSD of claim 4, wherein the one or more non-volatile memory devices operate according to the programming voltage supplied by the third voltage regulator after the first voltage falls below a predetermined threshold voltage, or an energy of the discrete capacitor falls below a predetermined threshold energy, after the event of the power loss or failure of the SSD occurs.

7. The SSD of claim 5, wherein the predetermined time is between 80% and 85% of a minimum hold-up time of the one or more non-volatile memory devices.

8. The SSD of claim 5, wherein the one or more non-volatile memory devices are configured to only operate according to the programming voltage supplied by the third voltage regulator if there are pending program or erase commands at the predetermined time.

9. The SSD of claim 6, wherein the predetermined threshold voltage is 50% or less of the first voltage of the discrete capacitor when substantially fully charged.

10. The SSD of claim 6, wherein the predetermined threshold energy is 25% or less of an energy of the discrete capacitor when substantially fully charged.

11. The SSD of claim 6, wherein the one or more non-volatile memory devices are configured to only operate according to the programming voltage supplied by the third voltage regulator if there are pending program or erase commands once the first voltage falls below the predetermined threshold voltage or the predetermined threshold energy.

12. The SSD of claim 1, wherein the one or more non-volatile memory devices are NAND flash memory devices.

13. A method of powering one or more non-volatile memory devices within a solid state drive (SSD), the method comprising:
   operating the one or more non-volatile memory devices according to a programming voltage for a program function or an erase function and to a supply voltage for a read function;
   supplying a first voltage with a discrete capacitor;
   converting the first voltage to a programming voltage;
   supplying the programming voltage to the one or more non-volatile memory devices during both a normal operation of the SSD and in the event of a power loss or failure of the SSD; and
   charging the discrete capacitor during the normal operation of the SSD,
   wherein, during the normal operation of the SSD, supplying the first voltage with the discrete capacitor that is converted to the programming voltage supplied to the one or more non-volatile memory devices for the program function or the erase function.

14. The method of claim 13, further comprising:
   converting a second voltage to a third voltage during the normal operation of the SSD;
   converting the first voltage to the third voltage in the event of the power loss or failure;
   converting the third voltage to the supply voltage; and
   supplying the supply voltage to the one or more non-volatile memory devices.

15. The method of claim 14, further comprising:
   converting the supply voltage supplied to the one or more non-volatile memory devices to the programming voltage at a predetermined time after the event of the power loss or failure of the SSD occurs.

16. The method of claim 14, further comprising:
   converting the supply voltage supplied to the one or more non-volatile memory devices to the programming voltage once the first voltage falls below a predetermined threshold voltage, or an energy of the discrete capacitor falls below a predetermined threshold energy, after the event of a power loss or failure of the SSD occurs.

17. The method of claim 15, wherein the predetermined time is between 80% and 85% of a minimum hold-up time of the one or more non-volatile memory devices.

18. The method of claim 15, wherein the supply voltage is converted to the programming voltage only if there are pending program or erase commands at the predetermined time.

19. The method of claim 16, wherein the predetermined threshold voltage is 50% or less of the first voltage supplied by the discrete capacitor when substantially fully charged.

20. The method of claim 16, wherein the predetermined threshold energy is 25% or less of an energy of the discrete capacitor when substantially fully charged.

21. The method of claim 16, wherein the supply voltage is converted to the programming voltage only if there are pending program or erase commands once the first voltage falls below the predetermined threshold voltage or the predetermined threshold energy.

22. The method of claim 13, wherein the one or more non-volatile memory devices are NAND flash memory devices.

* * * * *